United States Patent [19]
Loewenhardt et al.

[11] Patent Number: 6,030,486
[45] Date of Patent: Feb. 29, 2000

[54] MAGNETICALLY CONFINED PLASMA REACTOR FOR PROCESSING A SEMICONDUCTOR WAFER

[75] Inventors: Peter K. Loewenhardt, Santa Clara; Gerald Zheyao Yin, Sunnyvale; Philip M. Salzman, San Jose, all of Calif.

[73] Assignee: Applied Materials, Inc., Santa Clara, Calif.

[21] Appl. No.: 08/766,119

[22] Filed: Dec. 16, 1996

Related U.S. Application Data

[63] Continuation of application No. 08/590,998, Jan. 24, 1996, abandoned.

[51] Int. Cl.$^7$ .................................................. H05H 1/00
[52] U.S. Cl. .................. 156/345; 118/723 E; 118/723 I; 204/298.37
[58] Field of Search ................. 156/345; 118/723 E, 118/723 ER, 723 I; 204/298.37

[56] References Cited

U.S. PATENT DOCUMENTS

| | | | |
|---|---|---|---|
| 4,438,723 | 3/1984 | Cannella et al. | 118/718 |
| 4,440,107 | 4/1984 | Doehler et al. | 118/718 |
| 4,483,737 | 11/1984 | Mantei | 156/643 |
| 4,842,707 | 6/1989 | Kinoshita | 204/298 |
| 4,943,361 | 7/1990 | Kakehi et al. | 204/192.32 |
| 5,160,398 | 11/1992 | Yanagida | 156/345 |
| 5,178,739 | 1/1993 | Barnes et al. | |
| 5,224,441 | 7/1993 | Felts et al. | 118/718 |
| 5,346,579 | 9/1994 | Cook et al. | 156/345 |
| 5,401,351 | 3/1995 | Samukawa | 156/345 |
| 5,484,485 | 1/1996 | Chapman | 118/723 R |

FOREIGN PATENT DOCUMENTS

| | | | |
|---|---|---|---|
| 1073583 | 3/1986 | European Pat. Off. | 118/723 E |
| 56-131374 | 8/1982 | Japan . | |
| 123022 | 5/1991 | Japan . | |
| 722389 | 2/1995 | Japan . | |
| 264515 | 10/1996 | Japan . | |

*Primary Examiner*—Thi Dang
*Attorney, Agent, or Firm*—Michaelson and Wallace

[57] ABSTRACT

The invention confines the plasma within the chamber without relying entirely on the chamber walls by introducing a magnetic field across an area or plane through which plasma flow is to be stopped. For example, in order to prevent plasma from leaking or flowing through openings necessarily provided the chamber walls, a magnetic field is established at the entrance of the reactor chamber to such an opening, by placing a pair of opposing magnetic poles across the opening, for example. The magnetic field is sufficiently strong to prevent plasma leaking through the opening.

56 Claims, 4 Drawing Sheets

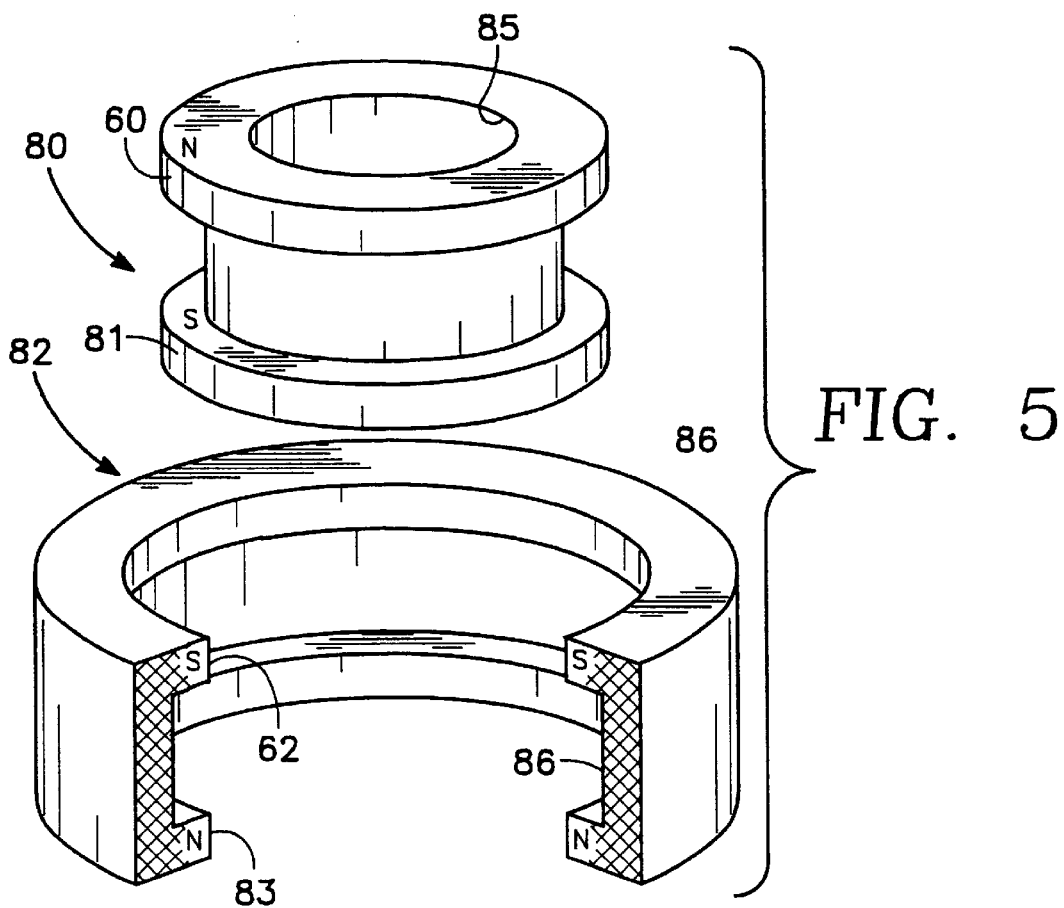
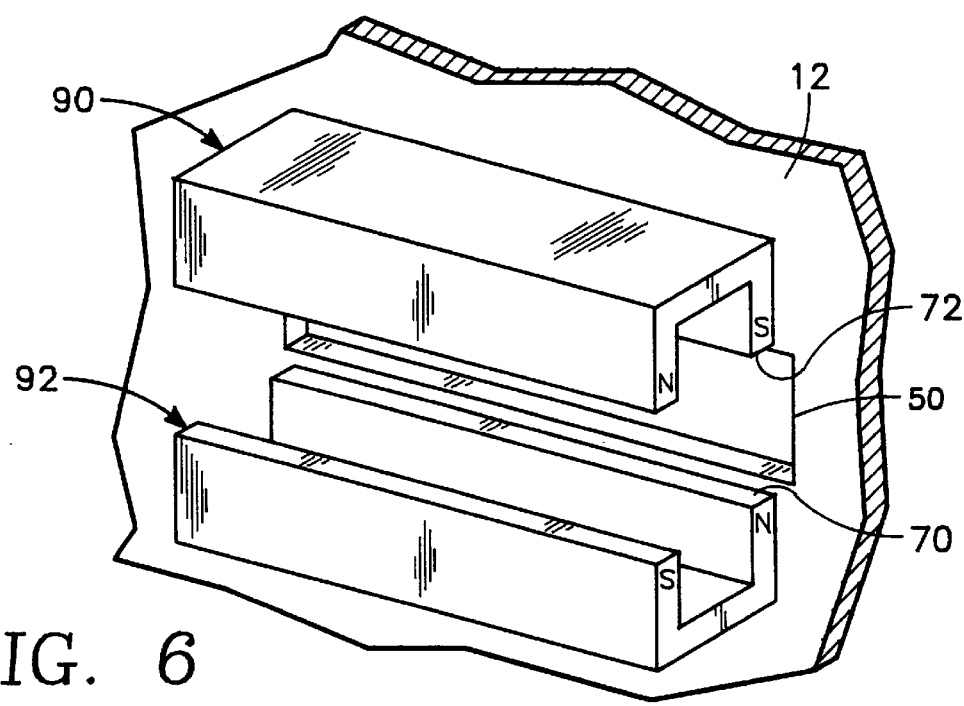

MAGNETICALLY CONFINED PLASMA REACTOR FOR PROCESSING A SEMICONDUCTOR WAFER

This is a continuation, of application Ser. No. 08/590,998, filed Jan. 24, 1996, now abandoned.

BACKGROUND OF THE INVENTION

1. Technical Field

The invention is related to plasma reactors for processing semiconductor wafers, and in particular confinement of the processing plasma in the reactor within a limited processing zone.

2. Background Art

Plasma reactors, particularly radio frequency (RF) plasma reactors of the type employed in semiconductor wafer plasma processing in the manufacturing of microelectronic integrated circuits, confine a plasma over a semiconductor wafer in the processing chamber by walls defining a processing chamber. Such an approach for plasma confinement has several inherent problems where employed in plasma reactors for processing semiconductor wafers.

First, the walls confining the plasma are subject to attack from ions in the plasma, typically, for example, by ion bombardment. Such attack can consume the material in the walls or introduce incompatible material from the chamber walls into the plasma process carried out on the wafer, thereby contaminating the process. Such incompatible material may be either the material of the chamber wall itself or may be material (e.g., polymer) previously deposited on the chamber walls during plasma processing, which can flake off or be sputtered off. As one example, if the chamber walls are aluminum and the plasma process to be performed is plasma etching of silicon dioxide, then the material of the chamber wall itself, if sputtered into the plasma, is incompatible with the process and can destroy the integrity of the process.

Second, it is necessary to provide certain openings in the chamber walls and, unfortunately, plasma tends to leak or flow from the chamber through these openings. Such leakage can reduce plasma density near the openings, thereby upsetting the plasma process carried out on the wafer. Also, such leakage can permit the plasma to attack surfaces outside of the chamber interior. As one example of an opening through which plasma can leak from the chamber, a wafer slit valve is conventionally provided in the chamber side wall for inserting the wafer into the chamber and withdrawing the wafer from the chamber. The slit valve must be unobstructed to permit efficient wafer ingress and egress. As another example, a pumping annulus is typically provided, the pumping annulus being an annular volume below the wafer pedestal coupled to a vacuum pump for maintaining a desired chamber pressure. The chamber is coupled to the pumping annulus through a gap between the wafer pedestal periphery and the chamber side wall. The flow of plasma into the pumping annulus permits the plasma to attack the interior surfaces or walls of the pumping annulus. This flow must be unobstructed in order for the vacuum pump to efficiently control the chamber pressure, and therefore the pedestal-to-side wall gap must be free of obstructions.

It is an object of the invention to confine the plasma within the chamber without relying entirely on the chamber walls and in fact to confine the plasma in areas where the chamber walls to not confine the plasma. It is a related object of the invention to prevent plasma from leaking or flowing through openings necessarily provided the chamber walls. It is an auxiliary object to so prevent such plasma leakage without perturbing the plasma processing of the semiconductor wafer.

It is a general object of the invention to shield selected surfaces of the reactor chamber interior from the plasma.

It is a specific object of one embodiment of the invention to shield the interior surface of the reactor pumping annulus from the plasma by preventing plasma from flowing through the gap between the wafer pedestal and the chamber side wall without obstructing free flow of charge-neutral gas through the gap.

It is a specific object of another embodiment of the invention to prevent plasma from flowing through the wafer slit valve in the chamber side wall without obstructing the ingress and egress of the wafer through the wafer slit valve.

SUMMARY OF THE DISCLOSURE

The invention confines the plasma within the chamber without relying entirely on the chamber walls by introducing a magnetic field across an area or plane through which plasma flow is to be stopped. For example, in order to prevent plasma from leaking or flowing through openings necessarily provided the chamber walls, a magnetic field is established at the entrance of the reactor chamber to such an opening, by placing a pair of opposing magnetic poles across the opening, for example. The magnetic field is sufficiently strong to reduce the leakage of plasma to the wall.

In order to prevent the magnetic poles perturbing the plasma processing of the semiconductor wafer, it is preferred that the opposing magnetic poles be part of a closed magnetic circuit. In one embodiment, the poles are opposite ends of a magnet facing each other across the opening. In a preferred embodiment, the opposing poles are on two different magnets, the poles of each magnetic facing the opposing poles of the other magnet, one pair of opposing poles of the two magnets facing each other across the opening through which plasma flow is to be stopped.

In general, the invention can shield a selected surface of the reactor chamber interior from the plasma by imposing a magnetic field across a path travelled by the plasma in reaching that surface.

One embodiment of the invention shields the interior surface of the reactor pumping annulus from the plasma by preventing plasma from flowing through the gap between the wafer pedestal and the chamber side wall without obstructing free flow of charge-neutral gas through the gap by imposing a magnetic field across the gap. In accordance with a first implementation, this field is produced by a pair of ring magnets having juxtaposed opposing circular poles, a pair of which face each other across the pedestal-to-sidewall gap and the other pair of which face each other across the pumping annulus. In accordance with a second implementation, there is only one pair of poles and the two ring magnets are joined as one by a core extending across the pumping annulus. Plural gas passages are provided through the core to permit gas flow through the pumping annulus.

Another embodiment of the invention prevents plasma from flowing through the wafer slit valve in the chamber side wall without obstructing the ingress or egress of the wafer through the valve by imposing a magnetic field across the slit opening of the valve. In accordance with one implementation, this is accomplished by a pair of horseshoe magnets having juxtaposed opposing poles, a pair of which face each other across the slit opening of the valve.

BRIEF DESCRIPTION OF THE DRAWINGS

FIG. 5 is a perspective view of a pair of opposing ring magnets juxtaposed across the pedestal-to-side wall gap.

FIG. 6 is a perspective view of a pair of opposing magnets juxtaposed across the wafer slit valve.

DETAILED DESCRIPTION OF THE PREFERRED EMBODIMENTS

Conventional Reactor Elements

Figure 1:
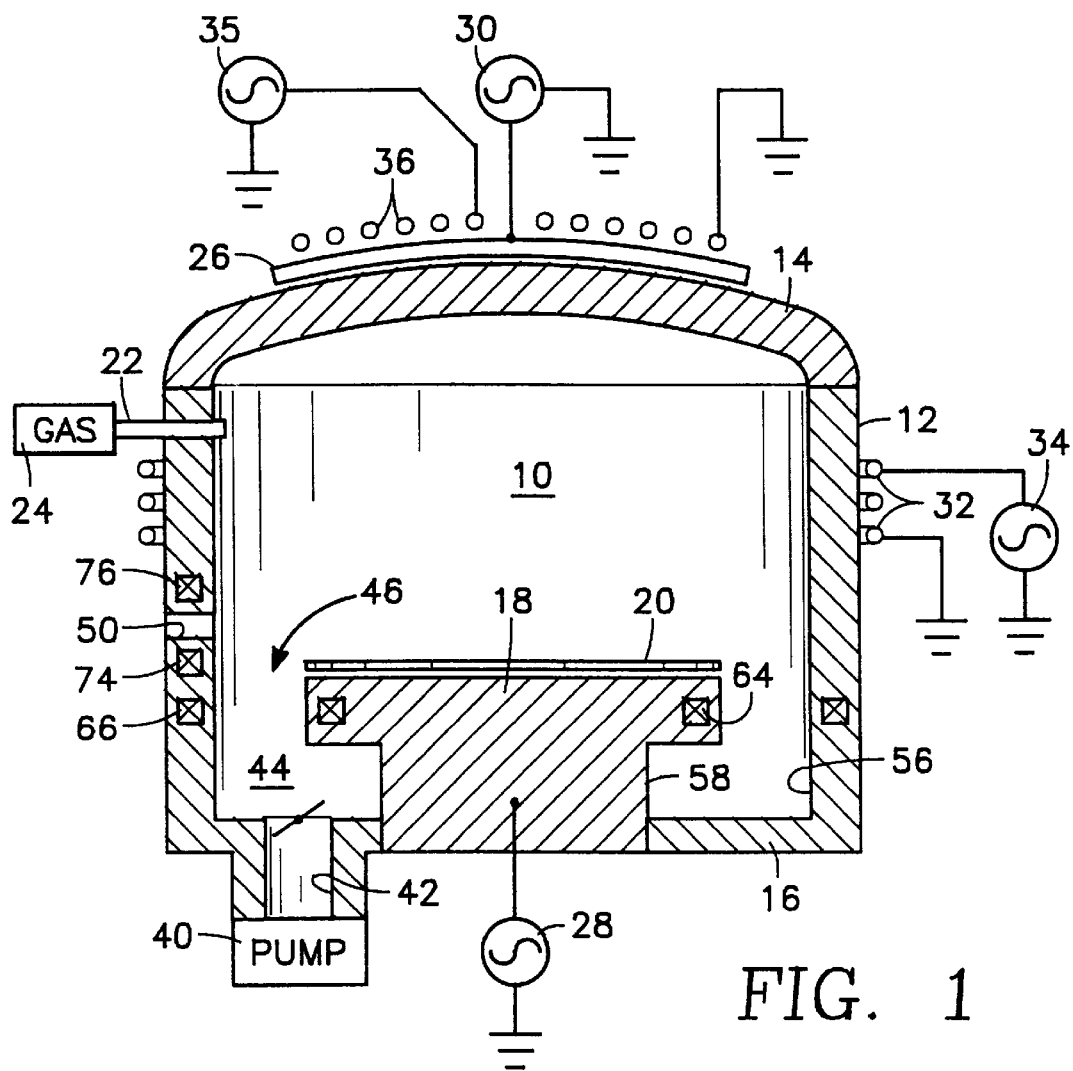
FIG. 1 is a cut-away side view of a plasma reactor in accordance with a first embodiment of the invention employing open magnetic circuits.

Referring to FIG. 1, an RF plasma reactor for processing a semiconductor wafer has a vacuum chamber 10 enclosed by a cylindrical side wall 12, a ceiling 14 and a floor 16. A wafer pedestal 18 supports a semiconductor wafer 20 which is to be processed. A plasma precursor gas is injected into the chamber 10 through a gas injector 22 from a gas supply 24. Plasma source power is coupled into the chamber 10 in any one of several ways. For example, the reactor may be a "diode" configuration, in which case RF power is applied across a ceiling electrode 26 and the wafer pedestal 18. This is accomplished by connecting the pedestal 18 and the ceiling electrode 26 to either one of two RF power sources 28, 30. Alternatively, a cylindrical side coil 32 wound around the chamber side wall 12 is connected to an RF power source 34. Alternatively to the foregoing, or in addition thereto, a top coil 36 is connected to an RF power supply. As is conventional, the wafer pedestal 18 may have its own independently controllable RF power supply 28 so that ion bombardment energy at the wafer surface can be controlled independently of plasma density, determined by the RF power applied to the coil 32 or the coil 36.

A vacuum pump 40 is coupled to the chamber 10 through a passage 42 in the floor 16. The annular space between the periphery of the wafer pedestal 18 and the floor 16 forms a pumping annulus 44 through which the vacuum pump 40 evacuates gas from the chamber 10 to maintain a desired processing pressure in the chamber 10. The pumping annulus 44 is coupled to the interior of the chamber 10 through an annular gap 46 between the periphery of the wafer pedestal 18 and the chamber side wall 14. In order for the pump 40 to perform efficiently, the gap 46 is preferably free of obstructions.

A conventional slit valve opening 50 of the type well-known in the art having a long thin opening in the chamber side wall 14 provides ingress and egress for a semiconductor wafer 52 to be placed upon and withdrawn from the wafer pedestal 18.

The walls 12, 14 confining the plasma within the chamber 10 are subject to attack from plasma ions and charged radicals, typically, for example, by ion bombardment. Such attack can consume the material in the walls 12, 14 or introduce incompatible material from the chamber walls 12, 14 into the plasma process carried out on the wafer 52, thereby contaminating the process. Such incompatible material may be either the material of the chamber wall itself or may be material (e.g., polymer) previously deposited on the chamber walls during plasma processing, which can flake off or be sputtered off. Plasma reaching the chamber walls can cause polymer deposition thereon.

The openings from the interior portion of the chamber 10, including the pedestal-to-side wall gap 46 and the slit valve opening 50, permit the plasma to leak or flow from the chamber 10. Such leakage can reduce plasma density near the openings 46, 50, thereby upsetting the plasma process carried out on the wafer 52. Also, such leakage can permit the plasma to attack surfaces outside of the chamber interior. The flow of plasma into the pumping annulus 44 through the gap 46 permits the plasma to attack the interior surfaces or walls of the pumping annulus 44. Thus, the designer must typically take into account not only the materials forming the chamber ceiling 12 and side wall 14, but in addition must also take into account the materials forming the pumping annulus, including the lower portion 56 of the side wall 14, the floor 16 and the bottom peripheral surface 58 of the wafer pedestal 18, which complicates the design. Such a loss of plasma from the chamber 10 also reduces plasma density or requires more plasma source power to maintain a desired plasma density over the wafer 52.

Magnetic Confinement

Figure 2:
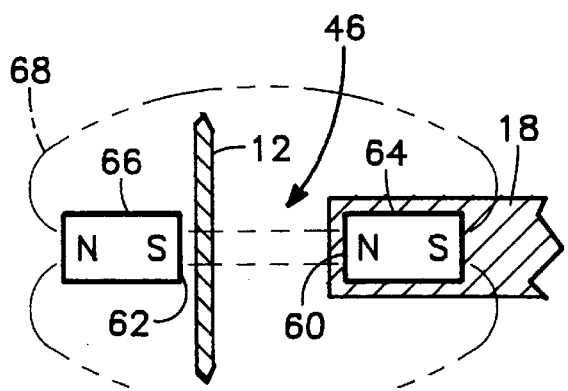
FIG. 2 is an enlarged view of the magnetic confinement apparatus near the pedestal-to-side wall gap.

In order to prevent plasma from flowing from the chamber 10 into the pumping annulus, a magnetic field perpendicular to the plane of the gap 46 and perpendicular to the direction of gas flow through the gap 46 is provided across the gap 46. This is preferably accomplished by providing an opposing pair of magnetic poles 60, 62 juxtaposed in facing relationship across the gap 46. In the embodiment according to FIG. 2, the magnetic pole 60 is the north pole of a magnet 64 located at the periphery of the wafer pedestal 18 while the magnetic pole 62 is the south pole of a magnet 66 next to the inner surface of the side wall 14. The embodiment of FIG. 2 may be regarded as an open magnetic circuit because the returning magnetic field lines of flux 68 in FIG. 2 radiate outwardly as shown in the drawing.

Figure 3:
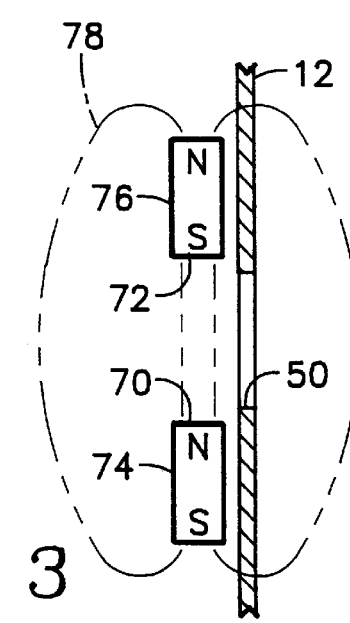
FIG. 3 is an enlarged view of the magnetic confinement apparatus near the wafer slit valve.

In order to prevent plasma from flowing from the chamber 10 through the slit valve opening 50, a magnetic field perpendicular to the plane of the slit valve opening 50 and perpendicular to the direction of gas flow through the slit valve opening 50 is provided across the slit valve opening 50. This is preferably accomplished by providing an opposing pair of magnetic poles 70, 72 juxtaposed in facing relationship across the slit valve opening 50. In the embodiment according to FIG. 3, the magnetic pole 70 is the north pole of a magnet 74 extending across the bottom edge of the slit valve opening 50 while the magnetic pole 72 is the south pole of a magnet 76 extending along the top edge of the slit valve opening 50. The embodiment of FIG. 3 may also be regarded as an open magnetic circuit because the returning magnetic field lines of flux 78 in FIG. 3 radiate outwardly as shown in the drawing.

One potential problem with the returning lines of magnetic flux 68 (FIG. 2) and 78 (FIG. 3) is that some returning flux lines extend near the wafer 52 and may therefore distort or perturb plasma processing of the wafer 52. In order to minimize or eliminate such a problem, a closed magnetic circuit (one in which returning magnetic lines of flux do not extend into the chamber) is employed to provide the opposing magnetic pole pairs 60, 62 and 70, 72. For example, in the embodiment of FIGS. 4 and 5, the opposing magnetic poles 60, 62 across the gap 44 are each a pole of a respective horseshoe ring magnet 80, 82 concentric with the wafer pedestal 18. The horseshoe ring magnet 80 has the north pole 60 and a south pole 81 while the horseshoe ring magnet has the south pole 62 and a north pole 83. The poles 60, 81 of the inner horseshoe ring magnet 80 are annuli connected at their inner radii by a magnetic cylindrical core annulus 85. Similarly, the poles 62, 83 of the outer horseshoe ring magnet 82 are annuli connected at their outer radii by a magnetic cylindrical core annulus 86. The magnetic circuit consisting of the inner and outer horseshoe ring magnets 80, 82 is a closed circuit because the lines of magnetic flux between the opposing pole pairs 60, 62 and 81, 83 extend straight between the poles and, generally, do not curve outwardly, at least not to the extent of the outwardly curving returning lines of flux 68, 78 of FIGS. 2 and 3.

Figure 4A:
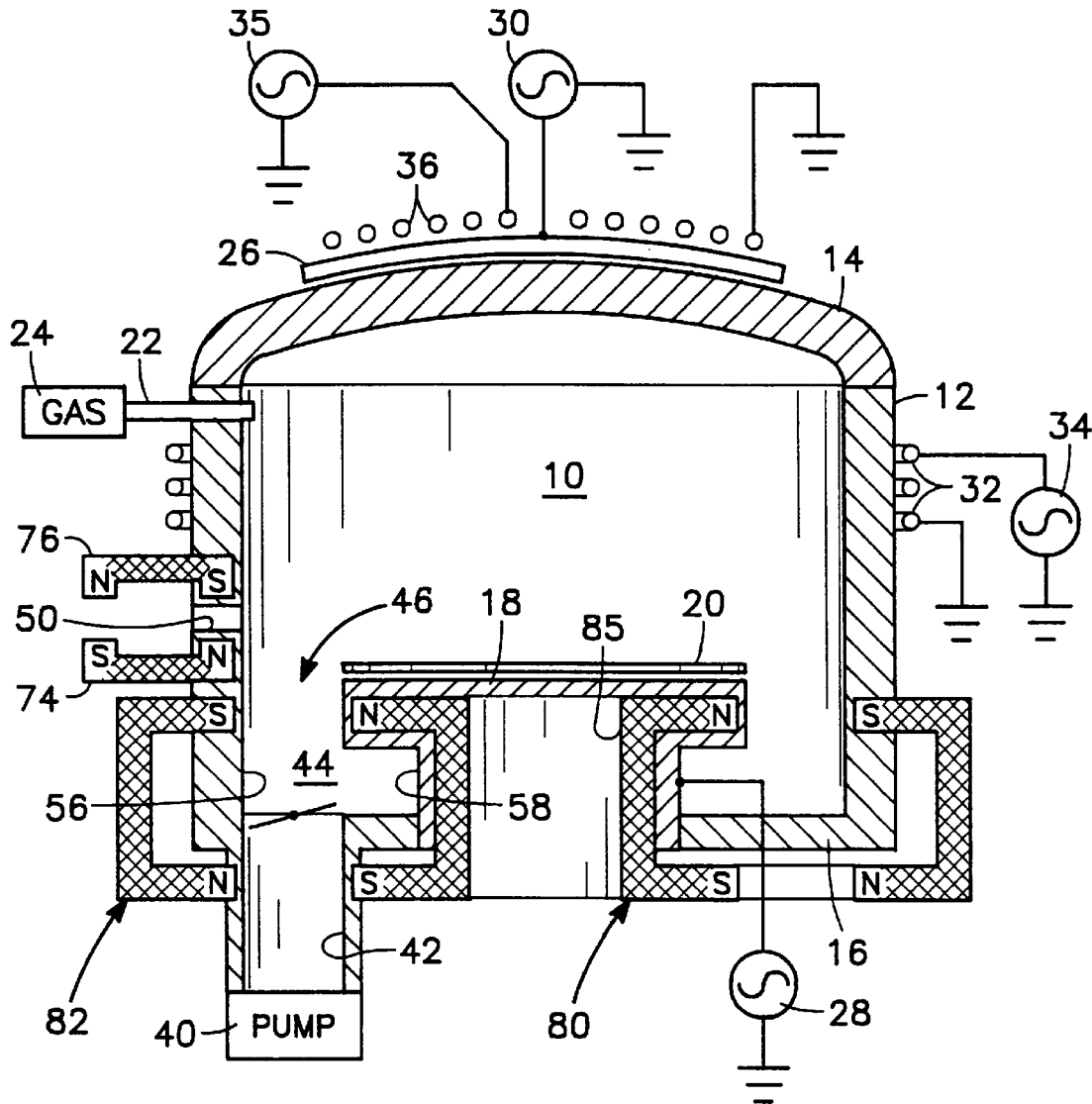
FIGS. 4A and 4B correspond to a side view of a plasma reactor in accordance with a preferred embodiment of the invention employing closed magnetic circuits having pairs of opposed magnets.
Figure 4B:
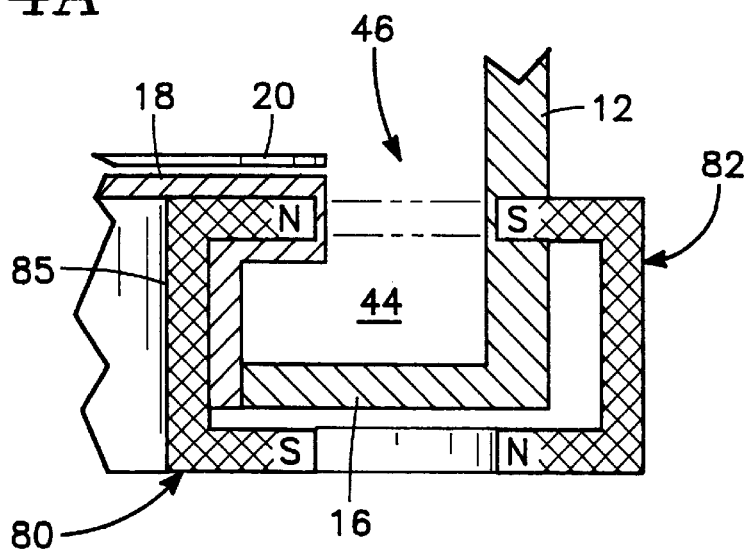

In the embodiment of FIGS. 4A, 4B and 6, the opposing magnetic poles 70, 72 across the slit valve opening 50 are each a pole of a respective long horseshoe magnet 90, 92 extending along the length of the slit valve opening 50, the long horseshoe magnet 90 extends along the top boundary of the slit valve opening 50 while the other horseshoe magnet extends along bottom edge of the slit valve opening 50.

The advantage of the closed magnetic circuit embodiment of FIG. 4 is that the magnetic field confining the plasma does not tend to interfere with plasma processing on the wafer surface.

Figure 7:
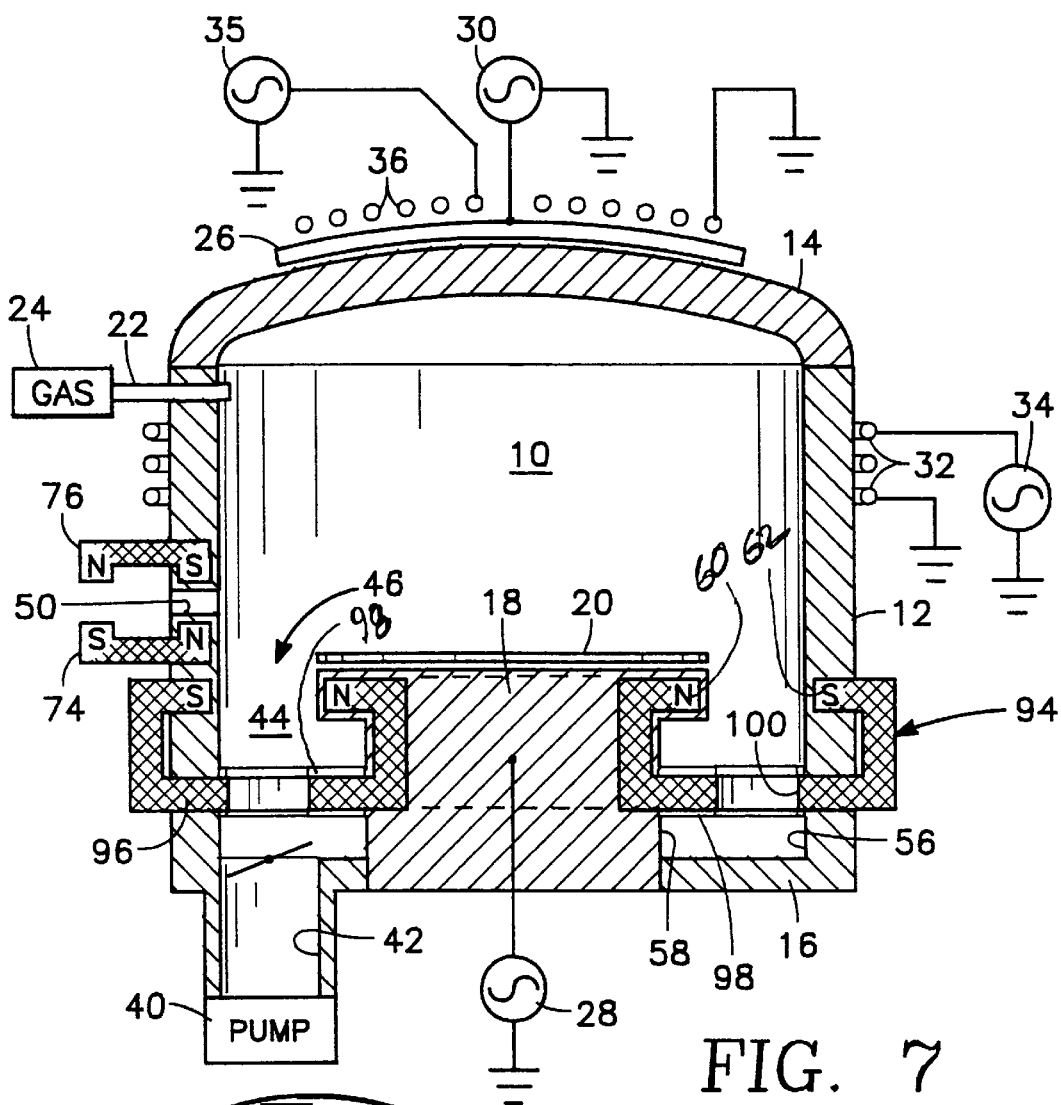
FIG. 7 is a cut-away side view of a plasma reactor in which the closed magnetic circuit is a single magnet whose opposing poles are juxtaposed across the pedestal-to-side wall gap and which are joined by a core extending across the pumping annulus.
Figure 8:
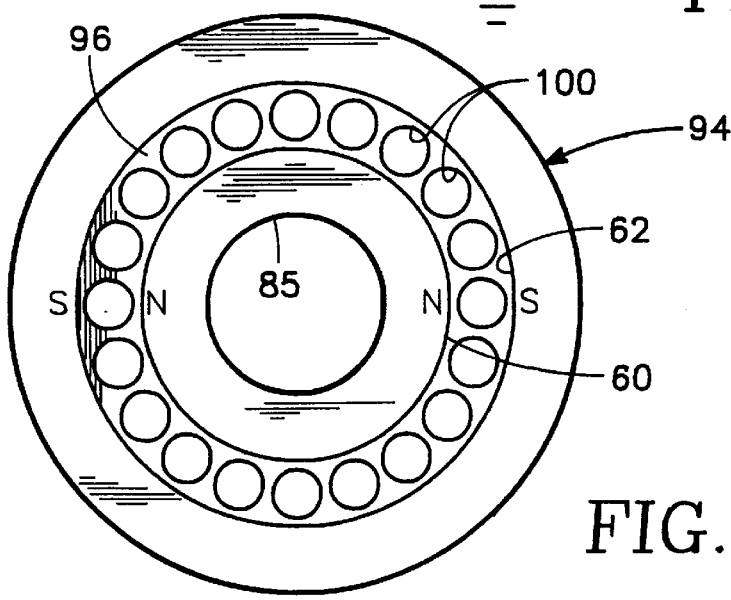
FIG. 8 is a top view of the single magnet of FIG. 7 and showing the gas flow holes through the core joining the opposite poles of the magnet.

In the embodiment of FIGS. 7 and 8, the lower annuli 81, 83 of the two horseshoe ring magnets 80, 82 are joined together as a single annulus by a magnetic core annulus 96, so that the horseshoe ring magnets 80, 82 constitute a single horseshoe ring magnet 94 having a north pole 60 and a south pole 62. The core annulus 96 extends across the pumping annulus 44 and can be protected by a protective coating 98 such as silicon nitride. In order to allow gas to pass through the pumping annulus 44, the core annulus 96 has plural holes 100 extending therethrough.

One advantage of the invention is that plasma ions are excluded from the pumping annulus 44. This is advantageous because the pumping annulus interior surfaces can be formed of any convenient material without regard to its susceptibility to attack by plasma ions or compatibility of its sputter by-products with the plasma process carried out on the wafer. This also eliminates reduction in plasma density due to loss of plasma ions through the pumping annulus. Another advantage is that gas flow through the pedestal-to-side wall gap 46 is not obstructed even though plasma is confined to the interior chamber 10 over the wafer. Furthermore, by so confining the plasma to a smaller volume (i.e., in the portion of the chamber 10 directly overlying the wafer 52), the plasma density over the wafer 52 is enhanced. A further advantage is that stopping plasma ions from exiting through the slit valve opening 50 eliminates loss of plasma density over portions of the wafer 52 adjacent the slit valve opening 50.

In one example, each of the magnetic pole pair 60, 62 has a strength of 20 Gauss for a distance across the gap 46 of 5 cm, while each of the magnetic pole pair 70, 72 has a strength of 20 Gauss for a width of the slit valve opening 50 of 2 cm.

While the invention has been described with reference to preferred embodiments in which the plasma confining magnets are protected from attack from plasma ions and processing gases by being at least partially encapsulated in the chamber walls or within the wafer pedestal or within a protective layer, in some embodiments (as for example, the embodiment of FIG. 6) the magnets may be protected by being located entirely outside of the chamber walls. Alternatively, if the reactor designer is willing to permit some plasma interaction with the magnets, magnets may be located inside the chamber in direct contact with the plasma, although this would not be preferred.

While the invention has been described in detail by specific reference to preferred embodiments, it is understood that variations and modifications thereof may be made without departing from the true spirit and scope of the invention.

What is claimed is:

1. An RF plasma reactor for processing a semiconductor wafer, comprising:
    a reactor chamber bounded by a chamber wall, and a gas inlet for furnishing a plasma precursor gas into said chamber;
    an RF power source and an RF coupler proximal said chamber and connected to said RF power source for coupling RF plasma source power into said chamber;
    a wafer pedestal in said chamber for supporting a semiconductor wafer to be processed in said reactor;
    a pumping annulus adjacent a peripheral portion of said chamber and a vacuum pump coupled to said pumping annulus, said pumping annulus being coupled to said chamber through a circumferential gap between said pedestal and said chamber wall; and
    a closed magnetic circuit comprising:
        a first pair of magnetic poles of opposite magnetic polarity disposed on a first side of said gap;
        a second pair of magnetic poles of opposite magnetic polarity disposed on a second side of said gap, said second side opposite said first, side said first and second pairs of magnetic poles having sufficient magnetic strength to prevent plasma ions in said chamber from traveling through said gap into said pumping annulus.

2. The reactor of claim 1 wherein said first and second pairs of magnetic poles are oriented such that each one of said first magnetic poles face a respective one of said second magnetic poles of opposite polarity across said gap.

3. The reactor of claim 2 wherein the poles of each one of said first and second pairs of respective magnetic poles face in opposite directions and said first and second pairs of magnetic poles are oriented end-to-end.

4. The reactor of claim 2 wherein said first and second pairs of magnetic poles are magnets that are oriented side-by-side whereby each pole of one magnet faces the opposite pole of the other magnet.

5. The reactor of claim 4 wherein said first pair of opposite magnetic poles of said pair of magnets face each other across said gap, while the remaining pair of magnetic poles face each other across said pumping annulus.

6. The reactor of claim 4 wherein each of said pair of magnets is a horseshoe magnet.

7. The reactor of claim 6 wherein:
    (a) a first one of said pair of magnets comprises:
        (1) an inner cylindrical core concentric with said wafer pedestal and having an inner top end and an inner bottom end,
        (2) a pair of inner annuli extending radially outwardly from said inner top end and said inner bottom end respectively, the poles of said first magnet being comprised in said pair of inner annuli respectively; and
    (b) the other one of said pair of magnets comprises:
        (1) an outer cylindrical core concentric with and surrounding said inner cylindrical core and having an outer top end and an outer bottom end, (2) a pair of outer annuli extending radially inwardly from said outer top end and said outer bottom end respectively, the poles of said other magnet being comprised within said pair of outer annuli respectively.

8. The reactor of claim 1 wherein said first and second pairs of magnetic poles comprise a single magnet, said single magnet comprising a core connecting said first and second pairs of opposite magnetic poles.

9. The reactor of claim 8 wherein said core extends through said pumping annulus.

10. The reactor of claim 9 further comprising gas passages through said core for permitting gas flow through said pumping annulus.

11. The reactor of claim 9 further comprising a protective coating around said core portion.

12. An RF plasma reactor for processing a semiconductor wafer, comprising:

a reactor chamber bounded by a chamber wall, and a gas inlet for furnishing a plasma precursor gas into said chamber;

an RF power source and an RF coupler proximal said chamber and connected to said RF power source for coupling RF plasma source power into said chamber;

a wafer pedestal in said chamber for supporting a semiconductor wafer to be processed in said reactor;

a pumping annulus adjacent a peripheral portion of said chamber and a vacuum pump coupled to said pumping annulus, said pumping annulus being coupled to said chamber through a circumferential gap between said pedestal and said chamber wall;

a first pair of magnetic poles of opposite magnetic polarity placed on respective opposing sides of said gap, said magnetic poles having sufficient magnetic strength to prevent plasma ions in said chamber from traveling through said cap into said pumping annulus;

a slit valve opening in said chamber wall and having opposing sides; and a pair of valve magnets, each of said valve magnets having one of its poles located along a respective opposing side of said slit valve opening, said poles along said opposing sides of said slit valve being of opposite magnetic polarities.

13. The reactor claim 12 wherein said pair of valve magnets are disposed end-to-end relative to one another so that only one pair of poles of the two magnets face one another.

14. The reactor of claim 12 wherein said pair of valve magnets are disposed side-by-side whereby each pole of each valve magnet faces an opposite pole of the other valve magnet.

15. The reactor of claim 14 wherein a first pair of facing poles of the two valve magnets face each other across said slit valve opening while the other pair of facing poles of said two valve magnets face each other at a location radially outwardly displaced from said slit valve opening.

16. The reactor of claim 15 wherein said facing poles are separated by gaps sufficient to permit passage of a semiconductor wafer therebetween.

17. The reactor of claim 14 wherein said valve magnets are horseshoe magnets.

18. An RF plasma reactor for processing a semiconductor wafer, comprising:

a reactor chamber bounded by a chamber wall, and a gas inlet for furnishing a plasma precursor gas into said chamber;

an RF power source and an RF coupler proximal said chamber and connected to said RF power source for coupling RF plasma source power into said chamber;

a wafer pedestal in said chamber for supporting a semiconductor wafer to be processed in said reactor;

a slit valve opening through said chamber wall affording ingress and egress of a wafer to and from said chamber, said slit valve opening having opposing sides defining said opening; and a pair of valve magnets, each of said valve magnets having one of its poles located along a respective opposing side of said slit valve opening, said poles along said opposing sides of said slit valve being of opposite magnetic polarities.

19. The reactor claim 18 wherein said pair of valve magnets are disposed end-to-end relative to one another so that only one pair of poles of the two magnets face one another.

20. The reactor of claim 18 wherein said pair of valve magnets are disposed in side-by-side whereby each pole of each valve magnet faces an opposite pole of the other valve magnet.

21. The reactor of claim 20 wherein a first pair of facing poles of the two valve magnets face each other across said slit valve opening while the other pair of facing poles of said two valve magnets face each other at a location radially outwardly displaced from said slit valve opening.

22. The reactor of claim 21 wherein said facing poles are separated by gaps sufficient to permit passage of a semiconductor wafer therebetween.

23. The reactor of claim 20 wherein said valve magnets are horseshoe magnets.

24. An RF plasma reactor for processing a semiconductor wafer, comprising:

a reactor chamber bounded by a chamber wall, and a gas inlet for furnishing a plasma precursor gas into said chamber;

an RF power source and an RF coupler proximal said chamber and connected to said RF power source for coupling RF plasma source power into said chamber;

a wafer pedestal in said chamber for supporting a semiconductor wafer to be processed in said reactor, said wafer pedestal dividing said chamber into an upper processing portion and a lower portion separated and a gap between said wafer pedestal and said chamber wall for gas flow between said upper and lower portions of said chamber; and a closed magnetic circuit comprising:
  a first pair of magnetic poles of opposite magnetic polarity disposed on a first side of said gap;
  a second pair of magnetic poles of opposite magnetic polarity disposed on a second side of said gap, said second side opposite said first side, said first and second pairs of magnetic poles having sufficient magnetic strength to confine plasma ions in said upper processing portion.

25. The reactor of claim 24 wherein said first and second pairs of magnetic poles are oriented such that each one of said first magnetic poles face a respective one of said second magnetic poles of opposite polarity across said gap.

26. The reactor of claim 25 wherein the poles of each one of said first and second pairs of respective magnetic poles face in opposite directions and said first and second pairs of magnetic poles are oriented end-to-end.

27. The reactor of claim 25 wherein said first and second pairs of magnetic poles are magnets that are oriented sideby-side whereby each pole of one magnet faces the opposite pole of the other magnet.

28. The reactor of claim 27 wherein each of said pair of magnets is a horseshoe magnet.

29. The reactor of claim 28 wherein:
   (a) a first one of said pair of magnets comprises:
      (1) an inner cylindrical core concentric with said wafer pedestal and having an inner top end and an inner bottom end,
      (2) a pair of inner annuli extending radially outwardly from said inner top end and said inner bottom end respectively, the poles of said first magnet being comprised in said pair of inner annuli respectively; and
   (b) the other one of said pair of magnets comprises:
      (1) an outer cylindrical core concentric with and surrounding said inner cylindrical core and having an outer top end and an outer bottom end,
      (2) a pair of outer annuli extending radially inwardly from said outer top end and said outer bottom end respectively, the poles of said other magnet being comprised within said pair of outer annuli respectively.

30. The reactor of claim 29 wherein said first and second pairs of magnetic poles comprise a single magnet, said single magnet comprising a core connecting said first and second pairs of opposite magnetic poles.

31. The reactor of claim 30 wherein said core extends through said lower portion of said chamber.

32. The reactor of claim 31 further comprising gas passages through said core for permitting gas flow through said lower portion of said chamber.

33. The reactor of claim 31 further comprising a protective coating around said core portion.

34. In an RF plasma chamber for processing a workpiece and provided with an opening:
   a closed magnetic circuit, comprising:
      a first pair of magnetic poles of opposite magnetic polarity, placed so that said opening is positioned therebetween;
      a second pair of magnetic poles of opposite magnetic polarity, placed so that said opening is positioned therebetween, said first and second pairs of magnetic poles being of sufficient magnetic strength to inhibit plasma from advancing into said opening from said chamber.

35. The combination of claim 34, in which the chamber further includes a workpiece support, and in which said magnetic poles are limited in magnetic strength so that the magnetic field adjacent the support is negligible.

36. The combination of claim 34, in which the chamber includes a workpiece support and in which said magnetic poles are spaced from said workpiece support so that the magnetic field adjacent the support is negligible.

37. The combination of claim 34, in which the chamber includes a workpiece support and in which the magnetic poles are positioned so as to direct the lines of magnetic force generally away from said workpiece support.

38. The combination of claim 34, in which the opposite faces of said first pair of opposed magnetic poles are approximately parallel to each other, and of traverse dimension greater than that of said opening, to minimize divergence of magnetic lines of force crossing said opening.

39. In an RF plasma chamber for processing a workpiece and provided with an opening:
   a first pair of opposed magnetic poles of opposite magnetic polarity, placed so that said opening is positioned therebetween, said magnetic poles being of sufficient magnetic strength to inhibit plasma from advancing into said opening from said chamber; and
   wherein the opposite faces of said first pair of opposed magnetic poles are closely spaced to each other and of transverse dimension greater than but comparable to that of said opening, to concentrate the magnetic field of said poles across said opening.

40. The combination of claim 34, which further includes a pair of magnets positioned with said opening therebetween, and with a North pole of one of said magnets facing a South pole of the other of said magnets, said North and South poles comprising said first pair of opposed magnetic poles.

41. In an RF plasma chamber for processing a workpiece and provided with an opening:
   a first pair of opposed magnetic poles of opposite magnetic polarity, placed so that said opening is positioned therebetween;
   a pair of magnets positioned with said opening therebetween, and with a North pole of one of said magnets facing a South pole of the other of said magnets, said North and South poles comprising said first pair of opposed magnetic poles;
   a magnetic return path connecting the two remaining poles of said magnet pair;
   said magnetic poles being of sufficient magnetic strength to inhibit plasma from advancing into said opening from said chamber.

42. The combination of claim 41, in which the chamber further includes a workpiece support, and said magnets and said magnetic return path is spaced from said workpiece support.

43. The combination of claim 34, which further includes a magnet positioned to one side of said opening with one pole of said magnet facing approximately transversely across said opening, and a magnetic return path member connected to the other pole of said magnet and terminating in a position opposite and facing said one pole, the terminating end of said magnetic return path member together with said one pole constituting said first pair of opposed magnetic poles.

44. The combination of claim 43, in which the chamber further includes a workpiece support, and said magnet and return path member is spaced from said workpiece support.

45. A method of confining a plasma within an RF plasma chamber utilized to process a workpiece, wherein said chamber has an opening into which plasma can enter unless confined, said method comprising:
   providing a closed magnetic circuit having a magnetic field, said magnetic field having lines of force directed across said opening and of sufficient magnitude across said opening to inhibit plasma ions from advancing into said opening from said chamber, said closed magnetic circuit oriented such that said lines of force are directed substantially away from said workpiece.

46. A method as in claim 45 in which the magnitude of said magnetic field at said workpiece is negligible.

47. A method as in claim 45 in which said magnetic lines of force are concentrated across said opening.

48. A method as in claim 45 in which said magnetic lines of force are substantially non-diverging across said opening.

49. In an RF plasma chamber for processing a workpiece and provided with an opening:
   a closed magnetic circuit comprising at least two pairs of magnetic poles of opposite magnetic polarity, said poles being positioned with said opening therebetween, said poles being of opposed area and strength to concentrate the magnetic flux across said opening while minimizing same elsewhere within the chamber.

50. The combination of claim 49 in which said chamber encloses a plasma processing volume, and in which at least one magnet provides said pair of magnetic poles and is positioned outside the plasma processing volume.

51. The combination of claim 49 which further includes a first magnetic member having two pole faces, with said pole faces of said first magnet facing each other in opposed manner with said opening therebetween, whereby the pole faces of said magnetic member comprise said pair of magnetic poles.

52. The combination of claim 51 in which the diameter of said pole faces approximates that of said opening.

53. The combination of claim 49 which further includes two magnets positioned so that one magnet has a pole face of one polarity facing a pole face of the opposite polarity of the other magnet, whereby said pole face of one polarity of said one magnet and said pole face of opposite polarity of the other magnet comprise said pair of magnetic poles.

54. The combination of claim 53 in which the diameter of said pole faces approximates that of said opening.

55. In an RF plasma chamber for processing a workpiece and provided with an opening:

a pair of magnetic poles of opposite magnetic polarity, said poles being positioned with said opening therebetween, said poles being of opposed area and strength to concentrate the magnetic flux across said opening while minimizing same elsewhere within the chamber; and a slit valve by which the workpiece may be introduced and removed from said chamber, and said poles are positioned on either side of said slit valve.

56. The combination of claim 49, in which said chamber is provided with a pumping annulus, and said poles are positioned so that said pumping annulus is located therebetween.

* * * * *